(12) United States Patent
Kubota et al.

(10) Patent No.: US 7,744,445 B2
(45) Date of Patent: Jun. 29, 2010

(54) POLISHING APPARATUS AND POLISHING METHOD

(75) Inventors: Takeo Kubota, Kanagawa (JP); Atsushi Shigeta, Kanagawa (JP); Gen Toyota, Oita (JP); Tamami Takahashi, Tokyo (JP); Daisaku Fukuoka, Tokyo (JP); Kenya Ito, Tokyo (JP)

(73) Assignees: Kabushiki Kaisha Toshiba, Tokyo (JP); Ebara Corporation, Tokyo (JP)

( * ) Notice: Subject to any disclaimer, the term of this patent is extended or adjusted under 35 U.S.C. 154(b) by 281 days.

(21) Appl. No.: 11/665,001

(22) PCT Filed: Oct. 12, 2005

(86) PCT No.: PCT/JP2005/019165

§ 371 (c)(1),
(2), (4) Date: Apr. 10, 2007

(87) PCT Pub. No.: WO2006/041196

PCT Pub. Date: Apr. 20, 2006

(65) Prior Publication Data

US 2009/0017730 A1 Jan. 15, 2009

(30) Foreign Application Priority Data

Oct. 15, 2004 (JP) ............................. 2004-302005

(51) Int. Cl.
*B24B 1/00* (2006.01)

(52) U.S. Cl. ............................. 451/41; 451/44; 451/59; 451/303; 451/311

(58) Field of Classification Search ................... 451/41, 451/44, 59, 296, 299, 303, 307, 311
See application file for complete search history.

(56) References Cited

U.S. PATENT DOCUMENTS 5,733,181 A * 3/1998 Hasegawa et al. ........... 451/168

(Continued)

FOREIGN PATENT DOCUMENTS

JP 47-32712 10/1972

(Continued)

*Primary Examiner*—Eileen P. Morgan
(74) *Attorney, Agent, or Firm*—Wenderoth, Lind & Ponack, L.L.P.

(57) ABSTRACT

A polishing apparatus has a polishing tape (21), a supply reel (22) for supplying the polishing tape (21) to a contact portion (30) at which the polishing tape (21) is brought into contact with a notch portion (11) of a substrate (10), and a take-up reel (23) for winding up the polishing tape (21) from the contact portion (30). The polishing apparatus also has a first guide portion (24) having as guide surface (241) for supplying the polishing tape (21) directly to the contact portion (30), and a second guide portion (25) having a guide surface for supplying the polishing tape (21) tot the take-up reel (23). The guide surface (241) of the first guide portion (24) and/or the guide surface of the second guide portion (25) has a shape corresponding to a shape of the notch portion (11) of the substrate (10).

13 Claims, 21 Drawing Sheets

U.S. PATENT DOCUMENTS

| | | | |
|---|---|---|---|
| 6,277,005 B1 * | 8/2001 | Reynen et al. ............... | 451/168 |
| 6,558,239 B2 * | 5/2003 | Kunisawa et al. ........... | 451/303 |
| 6,893,329 B2 * | 5/2005 | Tajima et al. ................. | 451/41 |
| 7,014,529 B1 * | 3/2006 | Kubota et al. ................... | 451/7 |
| 2001/0011002 A1 * | 8/2001 | Steere, III ................... | 451/168 |
| 2004/0106363 A1 * | 6/2004 | Ishii et al. ..................... | 451/65 |
| 2004/0185751 A1 * | 9/2004 | Nakanishi et al. .............. | 451/5 |
| 2005/0227591 A1 * | 10/2005 | Enomoto et al. .............. | 451/41 |

FOREIGN PATENT DOCUMENTS

| | | |
|---|---|---|
| JP | 08-001494 | 1/1996 |
| JP | 09-076148 | 3/1997 |
| JP | 2000-005997 | 1/2000 |

* cited by examiner

F I G. 4
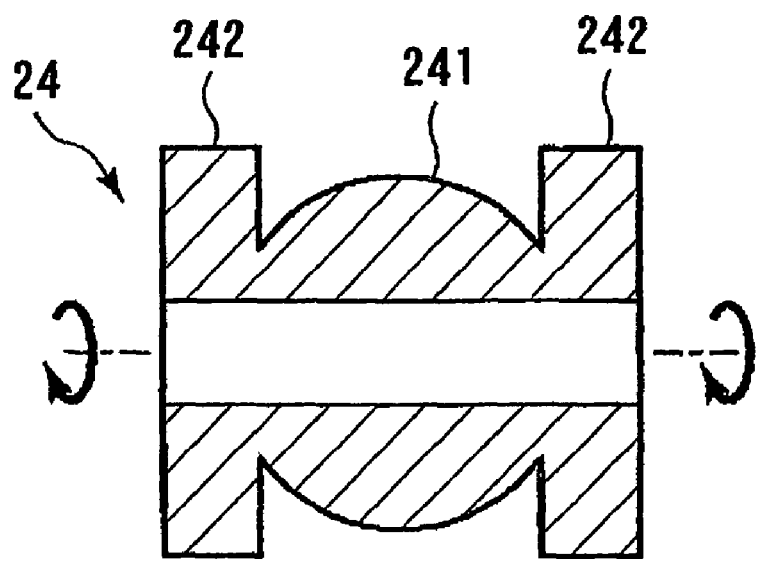
F I G. 5

F I G. 6
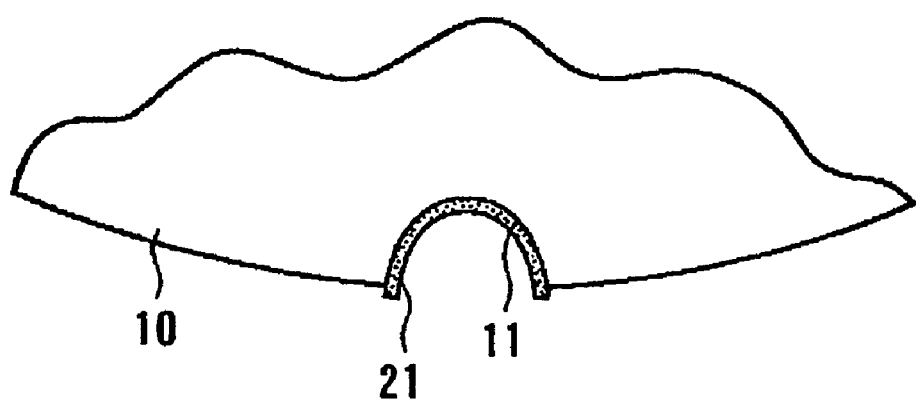

F I G. 14

F I G. 1 7 A
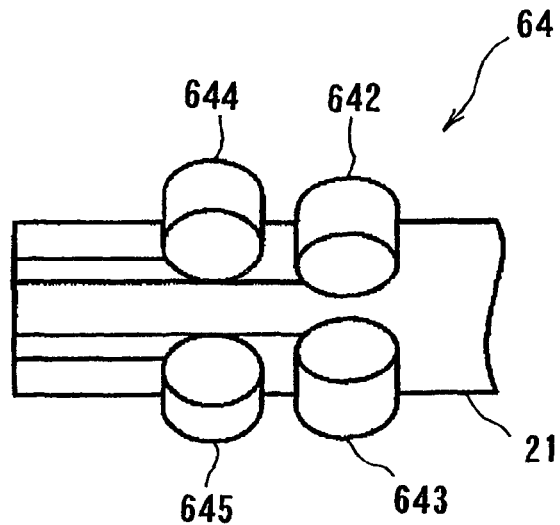
F I G. 1 7 B
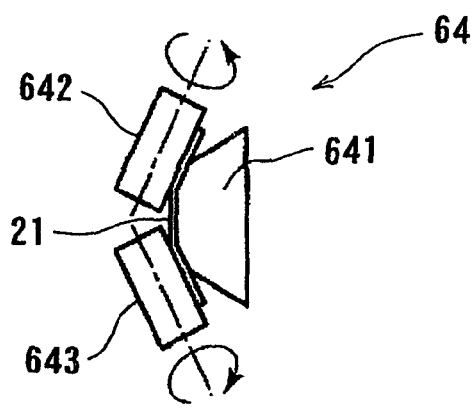
F I G. 1 7 C
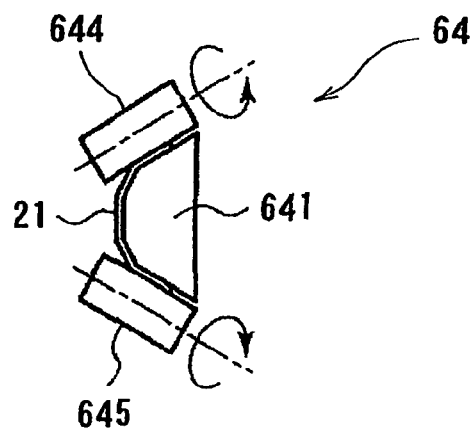

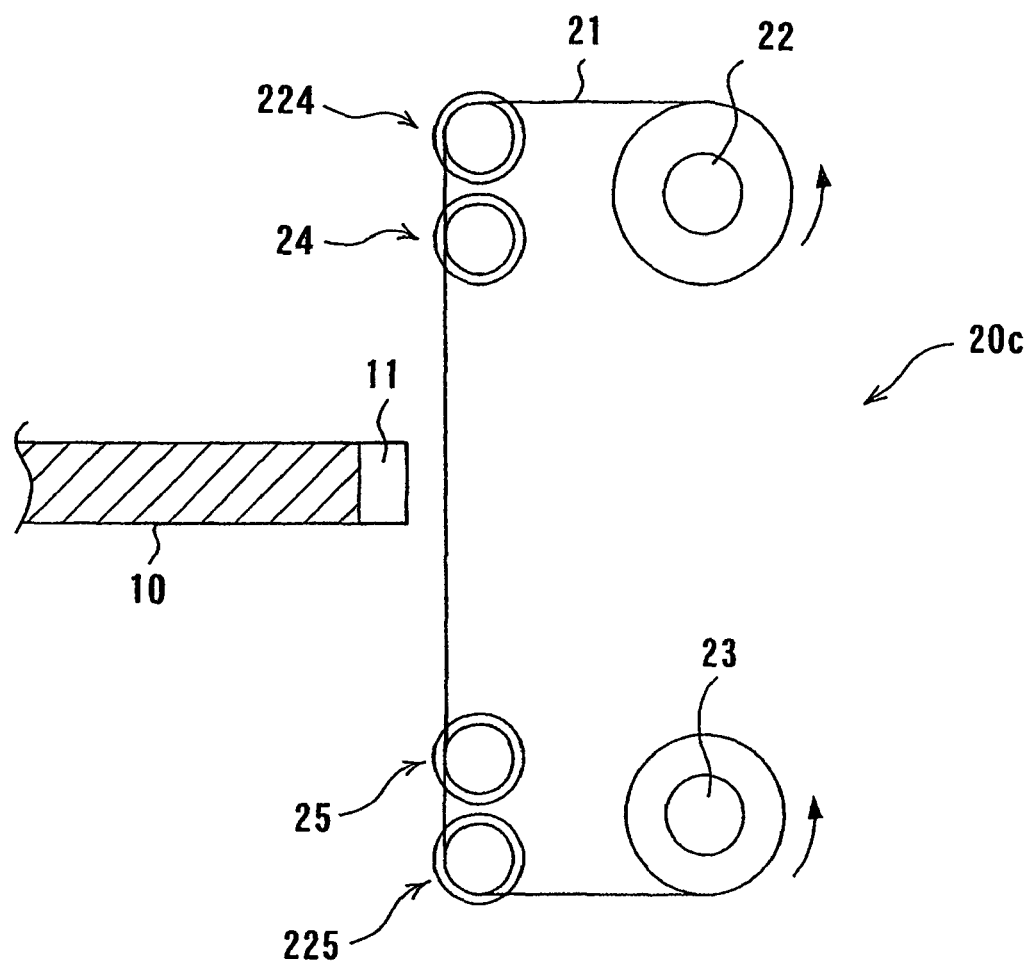
F I G. 2 4

POLISHING APPARATUS AND POLISHING METHOD

TECHNICAL FIELD

The present invention relates to a polishing apparatus and a polishing method, and more particularly to a polishing apparatus and a polishing method to polish a substrate such as a semiconductor wafer by a polishing tape.

BACKGROUND ART

Heretofore, a polishing tape having abrasive particles has been employed to polish a notch portion formed in a semiconductor wafer. Specifically, a polishing tape is brought into contact with a notch portion of a semiconductor wafer and moved in a direction perpendicular to a surface of the wafer to polish the notch portion of the wafer.

In this conventional method, a polishing tape is deformed along a notch portion of a wafer under a polishing load. Edge portions of the polishing tape may scratch the notch portion of the wafer according to polishing conditions. Accordingly, a wafer may be flawed or unevenly polished at the notch portion according to polishing conditions. Further, if the polishing tape is insufficiently deformed, an area of the polishing tape contacting the wafer is reduced so that it is difficult to conduct stable polishing. In this case, it is difficult to achieve uniform polishing. Additionally, it is uneconomic in that the entire surface of the polishing tape is not used for polishing. Further, if an area of the polishing tape contacting the wafer is small when a curved surface is polished, the wafer needs to be divided into several small areas, which are sequentially polished. Accordingly, it takes much time to complete the polishing process.

Thus, if polishing conditions are improperly set when the notch portion of the wafer is polished, there arise problems such as scratches on the wafer by the edge portions of the polishing tape or unevenly polishing. In order to overcome such problems, a polishing tape may be thinned so as to accord with a shape of the notch portion. However, when a polishing tape is thinned, resistance to tension is reduced. Thus, the polishing tape has a limitation of the thinness.

SUMMARY OF INVENTION

The present invention has been made in view of the above drawbacks. It is, therefore, a first object of the present invention to provide a polishing apparatus and a polishing method which can uniformly polish a notch portion or the like of a substrate such as a semiconductor wafer at a high speed without scratches on the substrate due to polishing by a polishing tape.

According to a first aspect of the present invention, there is provided a polishing apparatus which can achieve uniform and high-speed polishing without scratches on a substrate due to polishing. The polishing apparatus has a polishing tape, a supply reel for supplying the polishing tape to a contact portion at which the polishing tape is brought into contact with a portion of a substrate to be polished, and a take-up reel for winding up the polishing tape from the contact portion. The polishing apparatus also has a first guide portion having a guide surface for guiding the polishing tape from the supply reel to supply the polishing tape directly to the contact portion, a second guide portion having a guide surface for guiding the polishing tape supplied directly from the contact portion to supply the polishing tape to the take-up reel, and a drive mechanism configured to move the polishing tape and the substrate relative to each other. At least one of the guide surface of the first guide portion and the guide surface of the second guide portion has a shape corresponding to a shape of the portion of the substrate to be polished.

According to a second aspect of the present invention, there is provided a polishing method which can achieve uniform and high-speed polishing without scratches on a substrate due to polishing. According to this polishing method, a polishing tape is supplied to a guide surface of a first guide portion. The polishing tape is supplied from the guide surface of the first guide portion directly to a contact portion at which the polishing tape is brought into contact with a portion of a substrate to be polished. The polishing tape is supplied from the contact portion directly to a guide surface of a second guide portion. A portion of the polishing tape is deformed so as to correspond to a shape of the portion of the substrate to be polished by at least one of the guide surface of the first guide portion and the guide surface of the second guide portion. The portion of the substrate to be polished and the polishing tape are moved relative to each other to polish the portion of the substrate.

Specifically, when a polishing tape is brought into contact with a portion of a semiconductor substrate to be polished, and the substrate and the polishing tape are moved relative to each other to polish the portion of the substrate, a portion of the polishing tape is deformed so as to correspond to a shape of the portion of the substrate to be polished. For example, a portion of a polishing tape is brought into contact with a notch portion formed at a peripheral portion of a semiconductor substrate, and the polishing tape is moved in a direction perpendicular to a surface of the substrate to polish the notch portion. At that time, a portion of the polishing tape is deformed in a width direction of the polishing tape so as to correspond to a shape of the notch portion.

According to the present invention, a polishing tape is deformed so as to correspond to a shape of a portion such as a notch portion of a semiconductor substrate before the portion of the semiconductor substrate is polished. Therefore, the polishing tape becomes likely to be brought into uniform contact with the entire portion of the substrate to be polished. Accordingly, the substrate becomes unlikely to be scratched due to polishing. Thus, uniform and high-speed polishing can be achieved.

The above and other objects, features, and advantages of the present invention will be apparent from the following description when taken in conjunction with the accompanying drawings which illustrate preferred embodiments of the present invention by way of example.

BRIEF DESCRIPTION OF DRAWINGS

FIG. 4 is a cross-sectional view showing a first guide portion in the polishing mechanism of FIG. 3;

FIG. 5 is a cross-sectional view taken along line V-V of FIG. 3;

FIG. 6 is a plan view showing a contact state between a notch portion of a wafer and a polishing tape when the polishing mechanism of FIG. 3 is used;

FIG. 14 is a cross-sectional view showing a state in which the polishing head is set so as to polish an edge portion of the wafer in the polishing apparatus of FIG. 11;

FIG. 17A is a rear view showing a variation of the first guide portion of FIG. 8;

FIGS. 17B and 17C are cross-sectional views of the first guide portion shown in FIG. 17A;

FIG. 24 is a side cross-sectional view showing a third variation of the polishing mechanism of FIG. 3.

DETAILED DESCRIPTION OF PREFERRED EMBODIMENTS

Figure 1:
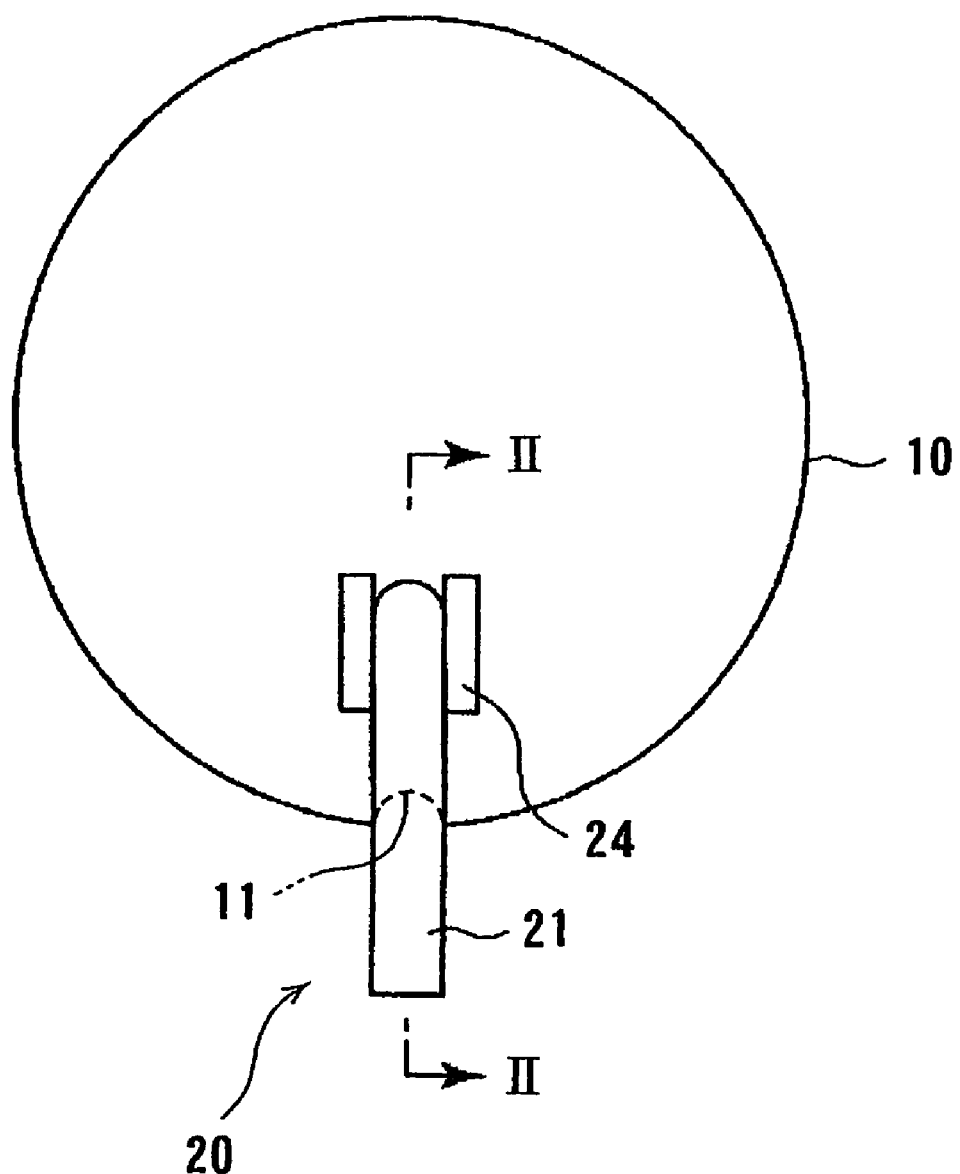
FIG. 1 is a plan view showing a polishing apparatus according to a first embodiment of the present invention.

Embodiments of a polishing apparatus according to the present invention will be described in detail below with reference to FIGS. 1 through 25. In FIGS. 1 through 25, like or corresponding parts are denoted by the same reference numerals and will not be described repetitively.

Figure 2:
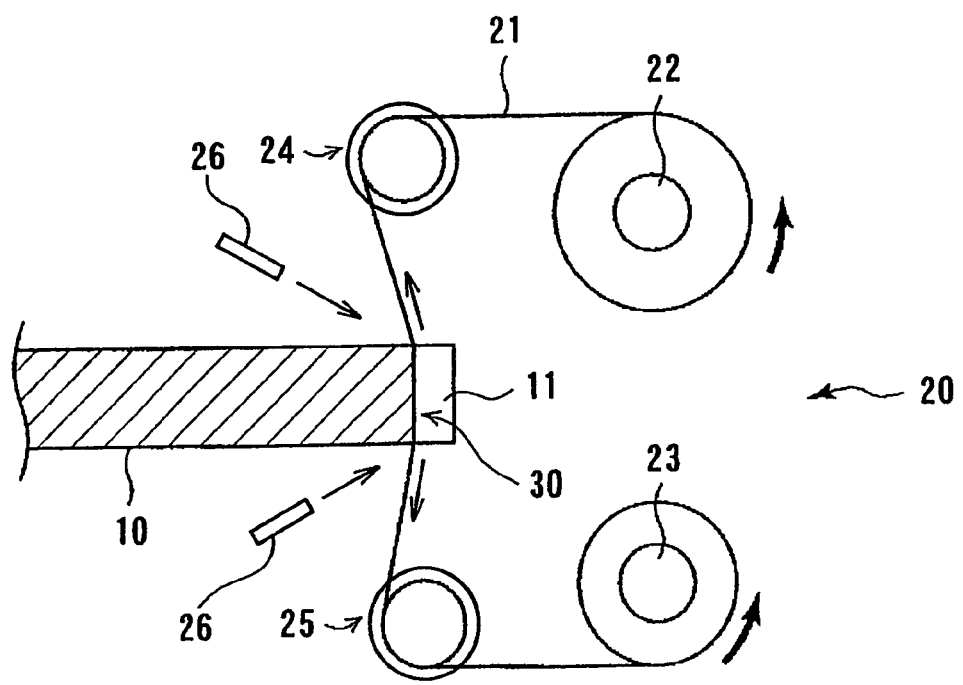
FIG. 2 is a cross-sectional view taken along line II-II of FIG. 1.

FIG. 1 is a plan view showing a polishing apparatus according to a first embodiment of the present invention, and FIG. 2 is a cross-sectional view taken along line II-II of FIG. 1. The polishing apparatus in the present embodiment serves to polish a notch portion formed in a peripheral portion of a semiconductor wafer. The polishing apparatus has a polishing mechanism 20 for polishing a notch portion 11 of a semiconductor wafer 10 held horizontally on a stage (not shown).

As shown in FIGS. 1 and 2, the polishing mechanism 20 has a polishing tape 21 with abrasive particles, a supply reel 22 for supplying a polishing tape 21 to a contact portion 30, at which the polishing tape 21 is brought into contact with a portion of the wafer 10 to be polished, a take-up reel 23 for winding up the polishing tape 21 from the contact portion 30, a first guide portion (guide roller) 24 for guiding the polishing tape 21 from the supply reel 22 to supply the polishing tape 21 directly to the contact portion 30, and a second guide portion (guide roller) 25 for guiding the polishing tape 21 supplied directly from the contact portion 30 to supply the polishing tape 21 to the take-up reel 23. Thus, the polishing tape 21 is supplied from the supply reel 22, guided by the first guide portion 24, then supplied to the contact portion 30 so as to be brought into contact with a portion of the wafer 10 to be polished, subsequently guided by the second guide portion 25, and wound up by the take-up reel 23. In the present embodiment, the first guide portion 24 and the second guide portion 25 have substantially the same structure.

In a case where a plurality of guide portions (guide rollers) are provided between the supply reel 22 and the contact portion 30 or between the take-up reel 23 and the contact portion 30, a pair of guide portions (guide roller) interposing the contact portion 30 therebetween that are positioned nearest the contact portion 30 on the polishing tape 21 correspond to the aforementioned first guide portion 24 and second guide portion 25.

The first guide portion 24 is disposed at a position above a front face of the wafer 10, and the second guide portion 25 is disposed at a position below a rear face of the wafer 10. The polishing tape 21 extends between the first guide portion 24 and the second guide portion 25 in a direction perpendicular to a surface of the wafer 10. A certain tension is applied to the polishing tape 21 between the first guide portion 24 and the second guide portion 25 so as to press the polishing tape 21 against the notch portion 11 of the semiconductor wafer 10 at the contact portion 30. The entire polishing mechanism 20 is configured to be moved in a vertical direction (a direction perpendicular to the surface of the wafer 10) by a drive mechanism (not shown) in a state such that the polishing tape 21 is brought into contact with the notch portion 11 of the wafer 10. Polishing liquid supply nozzles 26 are provided above and below the wafer 10 for ejecting a polishing liquid (pure water, acid, or alkali) to the front and rear faces of the wafer 10, respectively.

Figure 3:
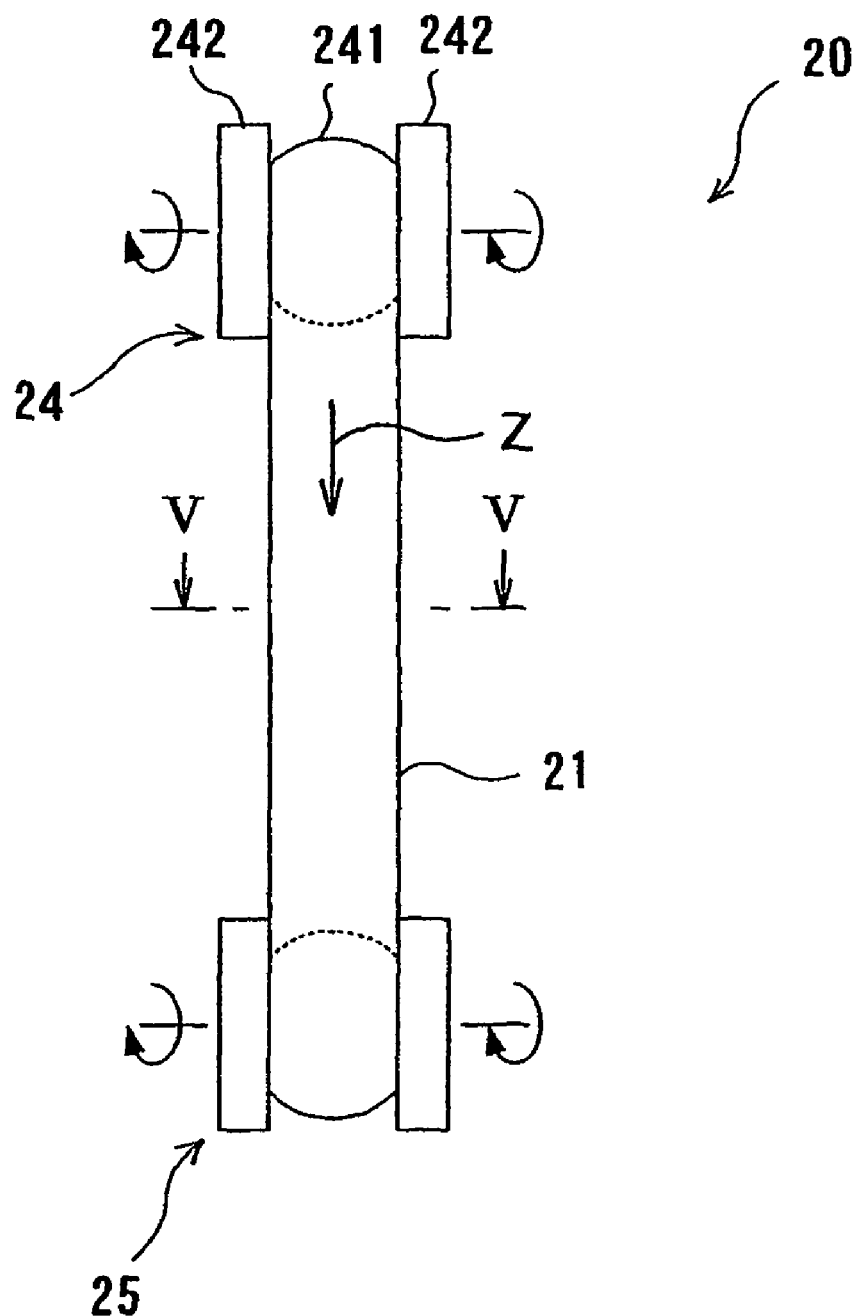
FIG. 3 is a front view showing a polishing mechanism in the polishing apparatus of FIG. 1.

FIG. 3 is a front view showing the polishing mechanism 20. As shown in FIG. 3, the first guide portion 24 has a guide surface 241 for guiding the polishing tape and a pair of flanges 242 interposing the guide surface 241 therebetween. The guide surface 241 is not flat but is curved. Specifically, the guide surface 241, which is interposed between the flanges 242, has a convex shape corresponding to a concave shape of the notch portion 11 in the wafer 10.

FIG. 4 is a cross-sectional view of the first guide portion 24 of FIG. 3 which is cut by a plane perpendicular to a feed direction of the polishing tape 21 (a direction Z in FIG. 3). As shown in FIG. 4, the guide surface 241 of the first guide portion 24 has a certain curvature in a cross-section perpendicular to the feed direction of the polishing tape 21. Specifically, the guide surface 241 of the first guide portion 24 includes a curved surface which is curved along a width direction of the polishing tape 21. In the present embodiment, the guide surface 241 of the first guide portion 24 and the flanges 242 are formed integrally with each other.

The polishing tape 21 is brought into abutment against the curved guide surface 241 under a certain pressing force. The curvature of the guide surface 241 is not zero in the cross-section perpendicular to the feed direction of the polishing tape 21. Accordingly, the polishing tape 21 that has passed through the guide surface 241 is curved along the width direction of the polishing tape 21 as shown in FIG. 5. Specifically, the polishing tape 21 is curved into an arcuate shape in the cross-section along the width direction after passing through the first guide portion 24.

When the polishing tape 21 is thus curved, as shown in FIG. 6, the polishing tape 21 curved in the width direction is brought into uniform contact with the entire surface of the notch portion 11 in the wafer 10. At that state, the polishing mechanism 20 is moved in the vertical direction by the drive mechanism to polish the notch portion 11 uniformly by the polishing tape 21.

The polishing tape 21 is wound up in the following manner. First, the polishing tape 21 of a certain length is curved in the aforementioned manner. The curved portion is brought into contact with the notch portion 11 of the wafer 10. The notch portion 11 is polished by vibration of the polishing mechanism 20. After polishing for a certain period of time, only a certain length of the polishing tape 21 is wound up so that a newly supplied portion of the polishing tape 21 is curved in the above manner. Thus, the new portion of the polishing tape 21 is brought into contact with the notch portion 11 of the semiconductor wafer 10. These processes are repeated so that a new portion of the polishing tape 21 is always brought into contact with the notch portion 11.

Further, the polishing tape 21 may be fed continuously in small amount when the notch portion 11 is polished by vibration of the polishing mechanism 20. In this case, it is not necessary to interrupt the polishing process to wind up the polishing tape 21.

A wafer 10 was polished with a polishing mechanism 20 in the present embodiment. A polishing tape having a thickness of 50 μm and a width of 8 mm in which diamond abrasive particles having a particle size of #4000 are attached to polyethylene terephthalate (PET) resin was used as a polishing tape 21. Polishing was conducted while the polishing tape 21 was continuously fed at a speed of 10 mm/min. The polishing tape 21 was supplied to a portion to be polished (contact portion 30) so that a shape deformed by the first guide portion 24 was maintained after the polishing tape 21 passed through the first guide portion 24. A tensile force was applied between a feeding side and a drawing side of the polishing tape 21. The polishing tape 21 was pressed against the notch portion 11 of the wafer 10 under a load of 1 kgf. The polishing mechanism 20 was vertically vibrated 30 times a minute to thereby polish the wafer 10. As a result, the notch portion 11 was satisfactorily polished without scratches due to polishing.

As described above, according to a polishing apparatus of the present embodiment, the first guide portion 24 having the curved guide surface 241 is used, and the polishing tape 21 is brought into abutment against the first guide portion 24 under a certain pressing force. Thus, prior to polishing, the polishing tape 21 can be curved along a curvature of the notch portion 11 in the semiconductor wafer 10. Accordingly, the polishing tape 21 can be brought into uniform contact with the entire surface of the notch portion 11. As a result, the notch portion 11 of the semiconductor wafer 10 becomes unlikely to be scratched due to polishing. Thus, uniform and high-speed polishing can be achieved.

Figure 7:
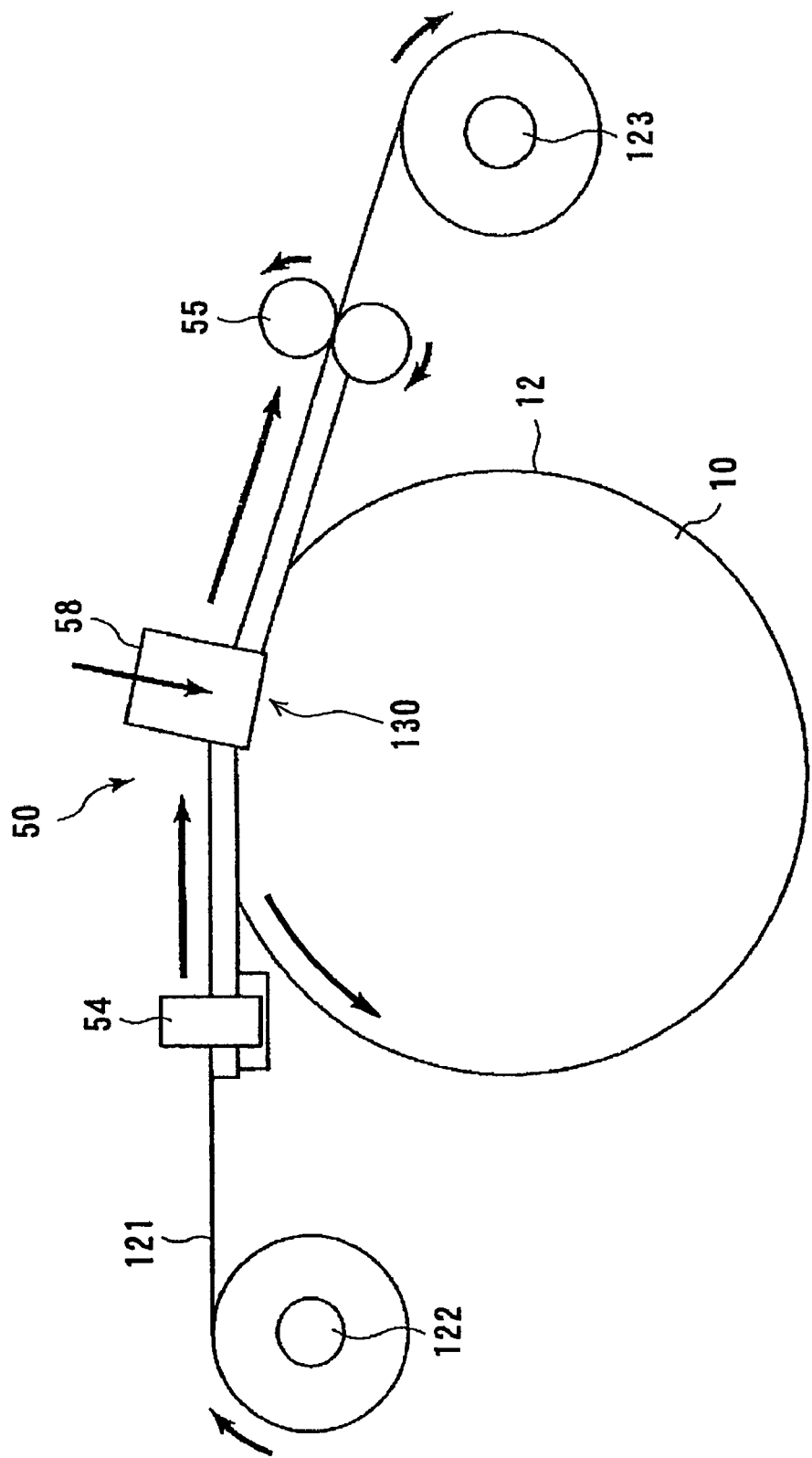
FIG. 7 is a plan view showing a polishing apparatus according to a second embodiment of the present invention.

FIG. 7 is a plan view showing a polishing apparatus according to a second embodiment of the present invention. The polishing apparatus in the present embodiment serves to polish a bevel portion at a peripheral portion of a wafer. The polishing apparatus has a polishing mechanism 50 for polishing a bevel portion 12 of a semiconductor wafer 10 held horizontally on a rotatable stage (not shown).

As shown in FIG. 7, the polishing mechanism 50 has a polishing tape 121 with abrasive particles, a supply reel 122 for supplying a polishing tape 121 to a contact portion 130, at which the polishing tape 121 is brought into contact with a portion of the wafer 10 to be polished, a take-up reel 123 for winding up the polishing tape 121 from the contact portion 130, a first guide portion 54 for guiding the polishing tape 121 from the supply reel 122 to supply the polishing tape 121 directly to the contact portion 130, a second guide portion (guide roller) 55 for guiding the polishing tape 121 supplied directly from the contact portion 130 to supply the polishing tape 121 to the take-up reel 123, a polishing head 58, and a drive mechanism (not shown) for rotating the rotatable stage.

The semiconductor wafer 10, the supply reel 122, and the take-up reel 123 are rotatable about respective shafts parallel to each other. The polishing tape 121 is supplied from the supply reel 122, guided by the first guide portion 54 and the second guide portion 55, and wound up by the take-up reel 123. The semiconductor wafer 10 is configured to be rotated in a state such that the polishing tape 121 is brought into contact with the bevel portion 12 of the wafer 10 when the stage is rotated.

Figure 8:
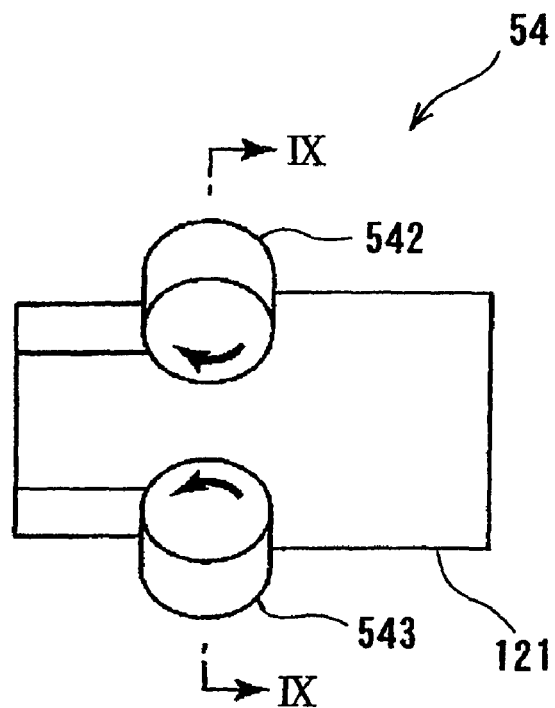
FIG. 8 is a back view showing a first guide portion in the polishing apparatus of FIG. 7.
Figure 9:
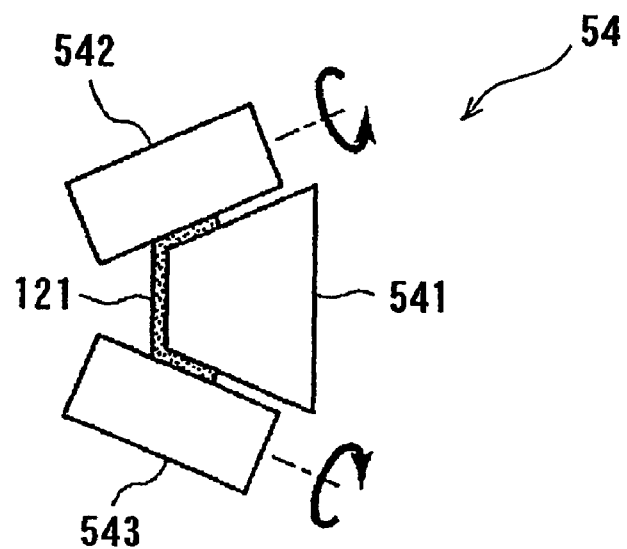
FIG. 9 is a cross-sectional view taken along line IX-IX of FIG. 8.

FIG. 8 is a back view showing the first guide portion 54, and FIG. 9 is a cross-sectional view taken along line IX-IX of FIG. 8. As shown in FIGS. 8 and 9, the first guide portion 54 includes a guide member 541 having a trapezoidal cross-section and a pair of columnar rollers 542 and 543 disposed along side surfaces of the guide member 541. The polishing tape 121 is guided by an upper surface of the guide member 541 and pressed against the side surfaces of the guide member 541 by the rollers 542 and 543.

Figure 10:
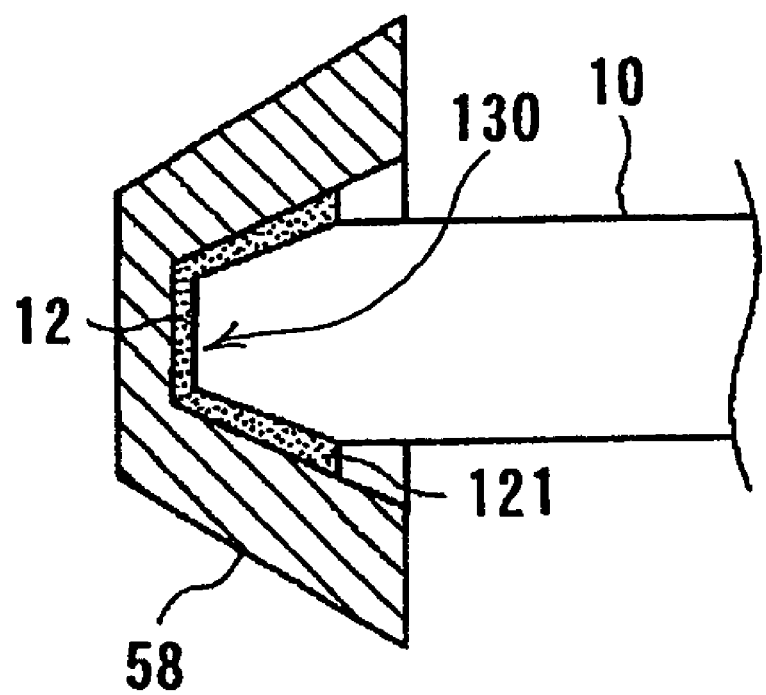
FIG. 10 is a cross-sectional view showing a contact state between a bevel portion of a wafer and a polishing tape in the polishing apparatus of FIG. 7.

With such an arrangement, the polishing tape 121 supplied from the supply reel 122 passes through the first guide portion 54 so as to be deformed into the same shape as a cross-section of the bevel portion 12 of the wafer 10. Then, the polishing tape 121 is brought into contact with the bevel portion 12 of the wafer 10 at the contact portion 130, where the polishing tape 121 is pressed against the bevel portion 12 of the wafer 10 by the polishing head 58. Thus, as shown in FIG. 10, the polishing tape 121 is brought into uniform contact with the entire surfaces (an edge surface, an upper slope, and a lower slope) of the bevel portion 12. At that state, the bevel portion 12 can be polished effectively by rotating the wafer 10. The polishing tape 121 used for polishing is returned into a substantially flat shape by the second guide portion 55 and then wound up by the take-up reel 123.

A wafer 10 was polished with a polishing mechanism 50 in the present embodiment. While a polishing tape 121 was continuously fed at a speed of 10 mm/min, the polishing tape 121 was pressed against a bevel portion 12 of the wafer 10, which was rotated at 500 rpm, under a load of 1 kgf to polish the bevel portion 12 of the wafer 10. As a result, the bevel portion 12 of the wafer 10 was satisfactorily polished.

As described above, according to a polishing apparatus of the present embodiment, since the polishing tape 121 is deformed so as to correspond to the bevel portion 12 of the semiconductor wafer 10, the polishing tape 121 is brought into contact with the entire surface of the bevel portion 12. Accordingly, scratches become unlikely to be caused by polishing, and uniform and high-speed polishing can be achieved. Further, the edge surface, the upper slope, and the lower slope of the bevel portion 12 can be polished simultaneously so that the polishing time can be reduced.

Figure 11:
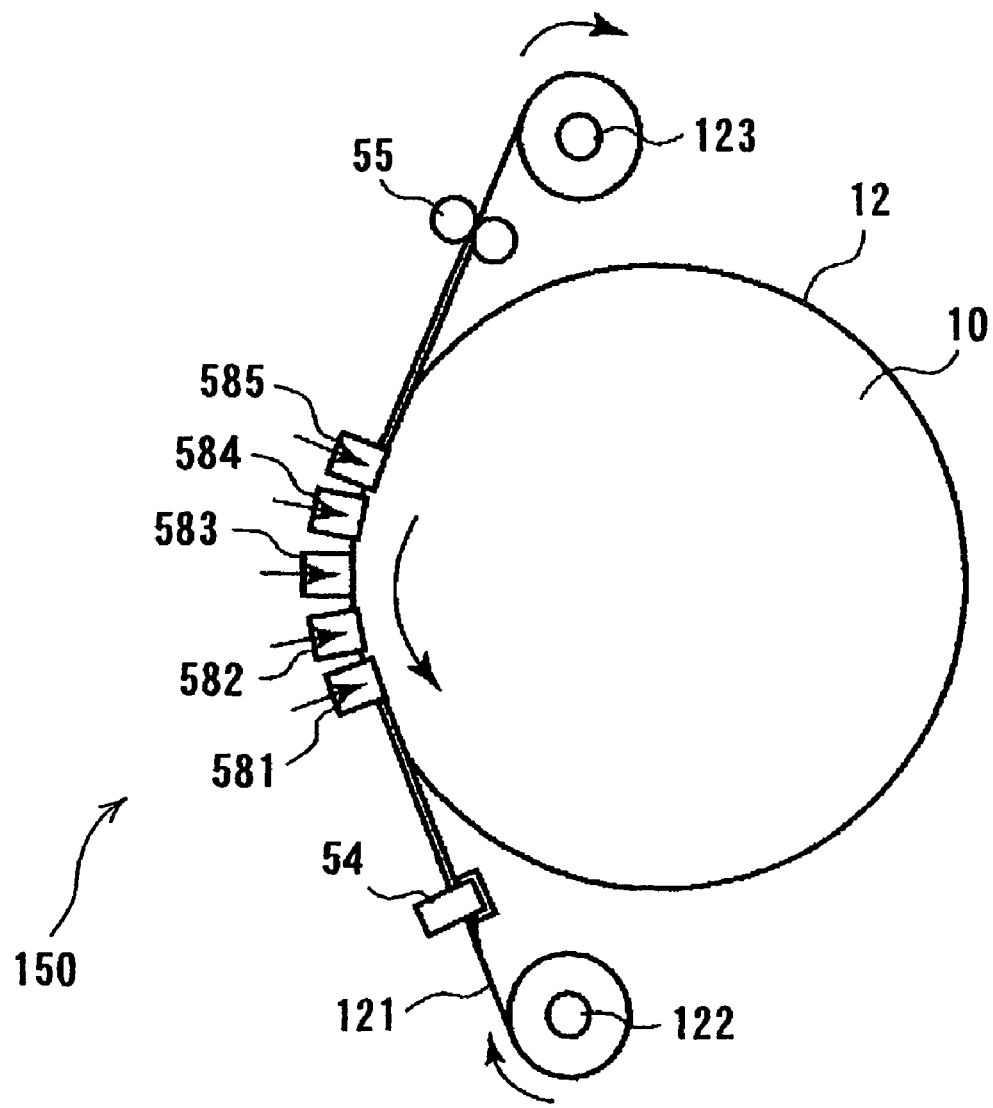
FIG. 11 is a plan view showing a polishing apparatus according to a third embodiment of the present invention.
Figure 12A:
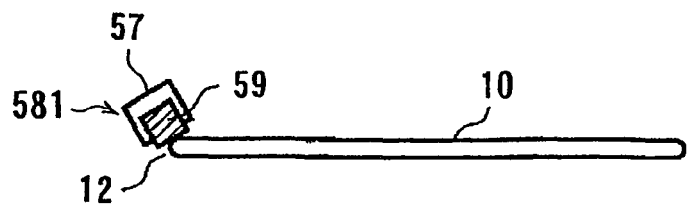
FIGS. 12A through 12E are side cross-sectional views showing each of polishing heads in the polishing apparatus of FIG. 11 together with a wafer.
Figure 12B:
Figure 12C:
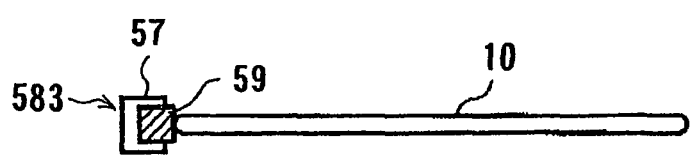
Figure 12D:
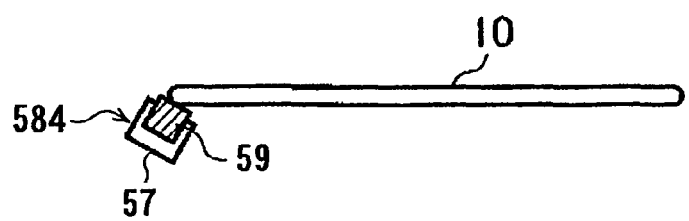
Figure 12E:
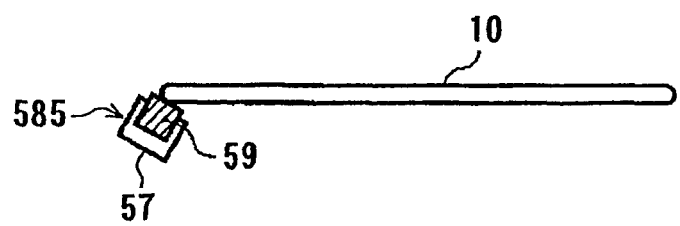

FIG. 11 is a plan view showing a polishing apparatus according to a third embodiment of the present invention. As with the polishing apparatus in the second embodiment, the polishing apparatus in the present embodiment serves to polish a bevel portion at a peripheral portion of a wafer. The polishing apparatus has a polishing mechanism 150 for polishing a bevel portion 12 of a semiconductor wafer 10 held horizontally on a rotatable stage (not shown).

As in the case of the polishing mechanism 50 in the second embodiment, the polishing mechanism 150 has a mechanism for supplying and winding up the polishing tape 121 (the supply reel 122 and the take-up reel 123) and a mechanism for deforming a shape of the polishing tape 121 into the same shape as a cross-section of the bevel portion 12 (the first guide portion 54). In the second embodiment described above, as shown in FIG. 7, the bevel portion 12 of the wafer 10 is polished by the single polishing head 58. In the present embodiment, the bevel portion 12 of the wafer 10 is polished by a plurality of polishing heads 581-585.

Specifically, the polishing apparatus in the present embodiment has a plurality of polishing heads, more specifically, five polishing heads 581-585. The polishing heads 581-585 are disposed at equal intervals so as to have predetermined angles about a center of the wafer. Each of the polishing heads 581-585 has a mechanism for changing an angle of the polishing head with respect to a surface of the wafer independently of the other polishing heads. Specifically, the five polishing heads 581-585 can be designed to adjust their angles arbitrarily. Further, polishing loads can also be set independently.

FIGS. 12A through 12E are side cross-sectional views showing each of the polishing heads 581-585 in FIG. 11 together with the wafer 10. As shown in FIGS. 12A through 12E, the five polishing heads 581-585 are brought into contact with the wafer 10 at predetermined angles. Each of the polishing heads 581-585 presses a portion of the polishing tape 121, which is deformed into the same shape as the bevel portion 12, against a portion of the bevel portion 12 of the wafer 10. When the polishing tape 121 passes through the five polishing heads 581-585, the entire surface of the bevel portion 12 is polished.

In the polishing tape 121 deformed (bent) into a trapezoidal cross-section excluding a lower side in a width direction as shown in FIG. 9, the polishing tape 121 is folded at boundaries of three surfaces of the trapezoid. Insufficient polishing is likely to be caused at those folded portions. Accordingly, in the present embodiment, the polishing tape 121 is pressed against the wafer 10 at a plurality of points so as to positively polish the aforementioned boundaries. The polishing tape 121 is pressed at portions gradually shifting from an upper surface to a lower surface of the wafer 10. Thus, when the polishing tape 121 passes through a plurality of polishing heads 581-585, the polishing tape 121 can smoothly accord with the bevel portion 12 so that wrinkles and creases are prevented from being produced.

The polishing heads 581-585 can independently press the polishing tape 121 against the wafer 10 and can also independently move away from the wafer 10. For example, three of the five polishing heads 581-585 may be used to press the polishing tape 121 against the wafer 10 while two of them are separated from the wafer 10. Further, the polishing heads 581-585 can be designed to adjust their angles arbitrarily. For example, all of the five polishing heads 581-585 may be set so as to have the same angle. Alternatively, the polishing heads 581-585 may be combined so that two of them press the polishing tape 121 against an upper surface of the wafer 10, that one presses the polishing tape 121 against a side surface of the wafer 10, and that two press the polishing tape 121 against a lower surface of the wafer 10. The polishing heads 581-585 may be configured such that the wafer 10 is polished at portions shifting from an upper surface, a side surface, and a lower surface after a portion of the wafer 10 passes through the first polishing head 581 before the portion of the wafer 10 passes through the last polishing head 585. Alternatively, by properly adjusting angles of the polishing heads 581-585, the wafer 10 can pass through the polishing heads 581-585 so that the side surface, the upper surface, and the lower surface of the wafer 10 are polished in turn.

Figure 13:
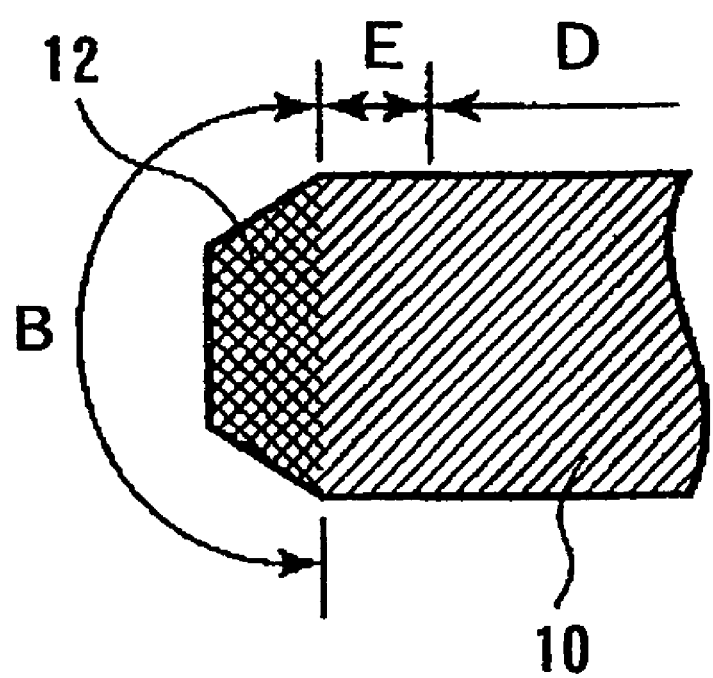
FIG. 13 is an enlarged cross-sectional view of a peripheral portion of the wafer.

FIG. 13 is an enlarged cross-sectional view of a peripheral portion of the wafer 10. Generally, the bevel portion 12 of the wafer 10 refers to an angled portion B of the peripheral portion of the wafer 10. An area E positioned between a boundary of the bevel portion B and an upper surface D in which devices of the wafer 10 are formed is referred to as an edge portion.

FIG. 14 shows an example in which an edge portion E is polished. Specifically, as shown in FIG. 14, the central polishing head 583 of the five polishing heads is pressed against the wafer 10 in a direction perpendicular to a central axis extending along a thickness of the wafer 10 so as to polish the edge portion E. In this case, a polishing tape having a large tape width is used as the polishing tape 121 so as to cover the edge portion E of the wafer 10. Thus, the polishing head can be configured to polish not only the bevel portion B but also the edge portion E by changing an angle of the polishing head. Accordingly, the bevel portion B and the edge portion E can be polished simultaneously with a plurality of polishing heads.

In the present embodiment, five polishing heads 581-585 are used. Additional polishing heads may be added on both sides of these five polishing heads so that the polishing mechanism has seven polishing heads. Two polishing heads may be used to polish the entire surface of the wafer by changing angles of the polishing heads during polishing. Thus, various modifications can be made to the polishing heads.

Figure 15:
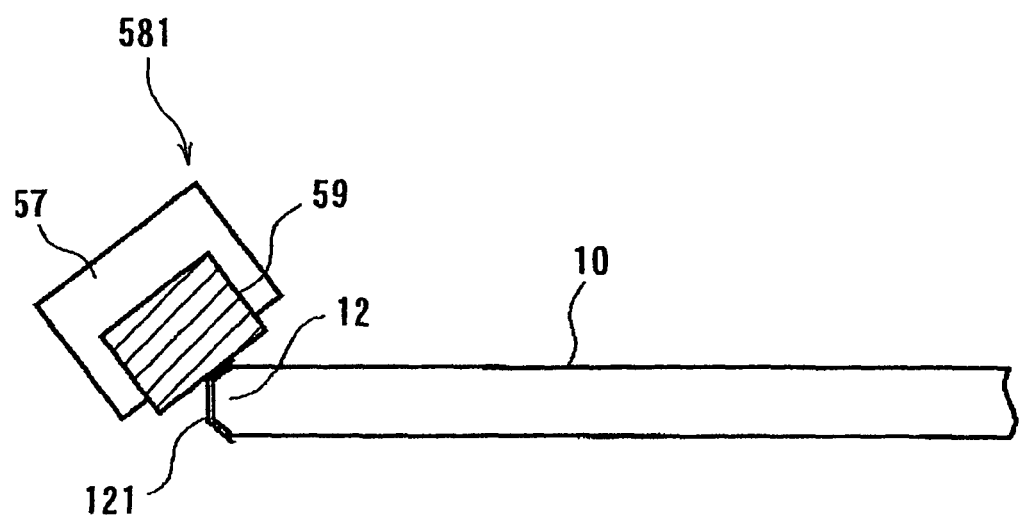
FIG. 15 is an enlarged cross-sectional view of a portion at which the polishing head is brought into contact with the wafer.

FIG. 15 is an enlarged cross-sectional view of a portion at which the polishing head 581 is brought into contact with the wafer 10. As shown in FIG. 15, the polishing head 581 has an elastic member 59 for pressing the polishing tape 121 against the semiconductor wafer 10 and a support member 57 for supporting the elastic member 59. The elastic member 59 is made of a material such as rubber or sponge so as to reduce damage to the wafer 10. Polishing properties such as a finish surface roughness, a polishing rate, and a polishing profile can be adjusted by changing a hardness of the elastic member 59 while the same polishing tape 121 is used.

Further, elastic members 59 having different elasticity may be attached to a plurality of polishing heads 581-585, respectively. For example, a soft elastic member may be used for a polishing head to press the polishing tape 121 against an upper surface of the wafer 10, and a hard elastic member may be used for a polishing head to press the polishing tape 121 against a side surface of the wafer 10. Further, while the polishing heads have the same angle, the hardness of elastic members of the polishing heads may be varied so as to change polishing properties as the wafer 10 passes the polishing heads.

Figure 16A:
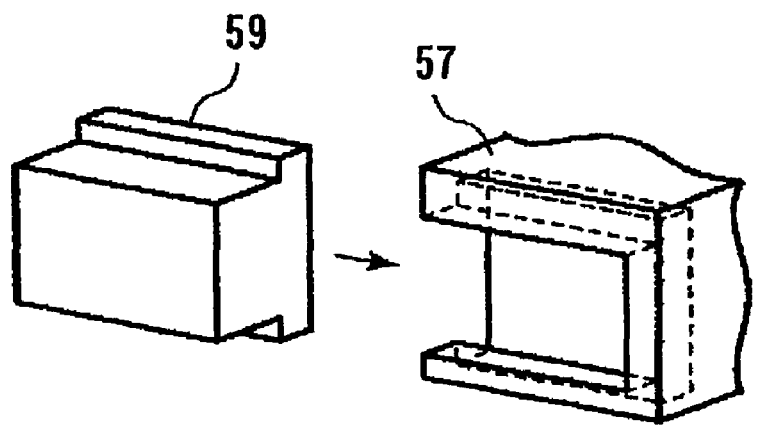
FIGS. 16A and 16B are perspective views showing a method of producing a polishing head in a polishing apparatus according to the third embodiment of the present invention.
Figure 16B:
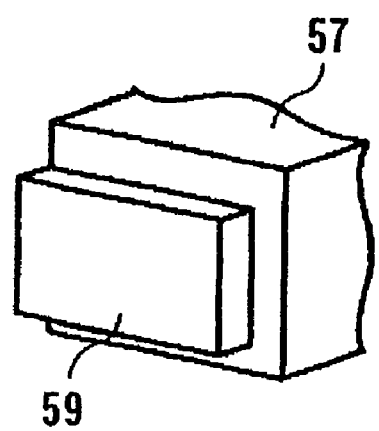
Figure 18A:
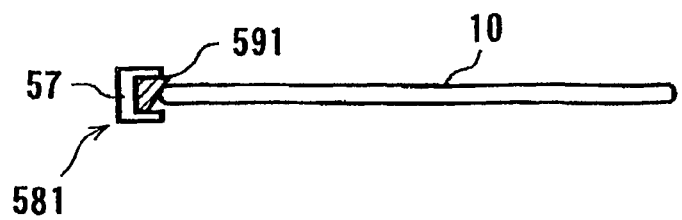
FIGS. 18A through 18E are side cross-sectional views showing a variation of the polishing head in the third embodiment.
Figure 18B:
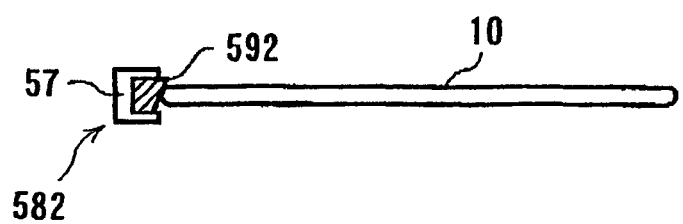
Figure 18C:
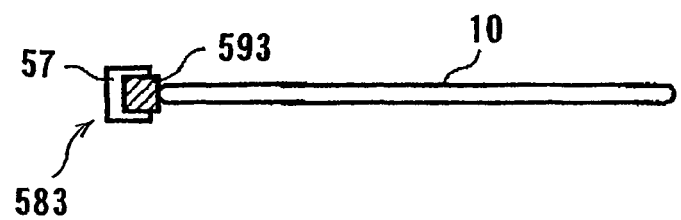
Figure 18D:
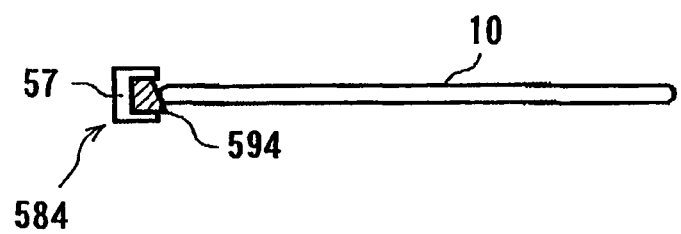
Figure 18E:
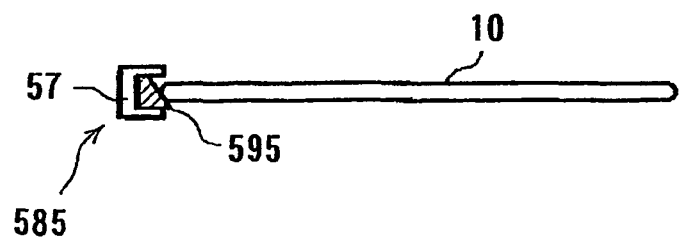

FIGS. 16A and 16B are views showing a manner to produce a polishing head in which an elastic member 59 is attached to a support member 57. As shown in FIG. 16A, the support member 57 has a portion formed to receive the elastic member 59. The elastic member 59 is inserted into a lower portion of the support member 57 as shown by arrow in a lateral direction. As shown in FIG. 16B, the elastic member 59 is received in the lower portion of the support member 57 to produce a polishing head. The polishing head thus produced has a structure for preventing the elastic member 59 from being removed on one side of the support member 57 even if a lateral force is applied due to rotation of the wafer or feed of the tape during polishing.

As described above, according to a polishing apparatus of the present embodiment, with a plurality of polishing heads which can adjust angles with respect to a wafer 10, it is possible to conduct polishing to accord with a shape of a bevel portion 12 of the wafer 10. Thus, it is possible to adjust a shape of the wafer 10. Further, polishing loads can be adjusted in each of the polishing heads 581-585. Accordingly, by setting polishing loads corresponding to angles of the polishing heads 581-585, it is possible to conduct polishing to accord with the shape of the bevel portion 12. Thus, it is possible to adjust a shape of the wafer 10.

Further, the elastic members 59 are provided for pressing the polishing tape 121 against the wafer 10. The material or hardness of the elastic members 59 can be clanged for each of a plurality of polishing heads 581-585. Accordingly, the hardness can be varied as the wafer 10 passes through the polishing heads 581-585. Thus, it is possible to control a finish roughness of the wafer 10 in particular.

Here, a first guide portion 64 as shown in FIGS. 17A through 17C may be used instead of the first guide portion 54 in the second and third embodiments described above. As shown in FIGS. 17A through 17C, the first guide portion 64 includes a guide member 641 having a trapezoidal cross-section and two pairs of columnar rollers 642, 643 and 644, 645 disposed along side surfaces of the guide member 641. The two pairs of rollers 642, 643 and 644, 645 are disposed along a feed direction of the polishing tape 121. In this example, the polishing tape 121 is guided by an upper surface of the guide member 641 having the trapezoidal cross-section, deformed by the preceding rollers 642 and 643, and further deformed by the following rollers 644 and 645. Thus, the polishing tape 121 can be deformed so as to accord with five polishing angles as shown in the third embodiment.

Further, polishing heads 581-585 as shown in FIGS. 18A through 18E may be employed as variations of the polishing heads in the third embodiment. In this example, angles of the polishing heads 581-585 are fixed, but angles of surfaces contacting the polishing tape 121 are varied in elastic members 591-595 of the respective polishing heads 581-585. Thus, the polishing tape 121 is pressed against the wafer 10 at respective predetermined angles. As described above, the surfaces of the elastic members 591-595 to press the polishing tape 121 against the wafer 10 are slopes. These elastic members 591-595 are attached to the polishing heads 581-585. Accordingly, it is possible to readily achieve polishing with a plurality of angles. Therefore, it is possible to dispense with the aforementioned mechanism for changing angles of the polishing heads.

Figure 19:
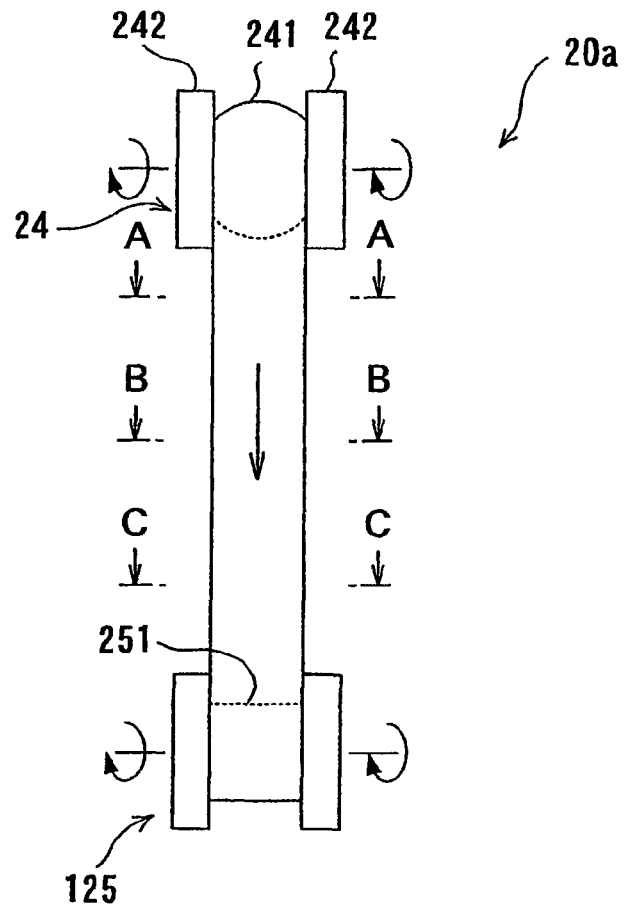
FIG. 19 is a front view showing a first variation of the polishing mechanism of FIG. 3.

FIG. 19 is a front view showing a first variation 20a of the polishing mechanism 20 in the first embodiment described above. The polishing mechanism 20a employs a second guide portion 125 having a substantially flat guide surface 251, which has a curvature of zero in a cross-section perpendicular to a feed direction of the polishing tape 21, instead of the second guide portion 25 shown in FIG. 3. Other elements are the same as the polishing mechanism 20 shown in FIG. 3.

Figure 20A:
FIG. 20A is a cross-sectional view taken along line A-A of FIG. 19.
Figure 20B:
FIG. 20B is a cross-sectional view taken along line B-B of FIG. 19.
Figure 20C:
FIG. 20C is a cross-sectional view taken along line C-C of FIG. 19.

With such an arrangement, the polishing tape 21 is brought into contact with the curved guide surface 241 of the first guide portion 24 while a certain tension is applied to the polishing tape 21. Accordingly, the polishing tape 21 is curved near the first guide portion 24 into an arcuate shape along the guide surface 241 of the first guide portion 24 as shown in FIG. 20A Further, the polishing tape 21 is brought into contact with the substantially flat guide surface 251 of the second guide portion 125 while a certain tension is applied to the polishing tape 21. Accordingly, the polishing tape 21 becomes substantially flat near the second guide portion 125 along the guide surface 251 of the second guide portion 125 as shown in FIG. 20C. Thus, the polishing tape 21 between the first guide portion 24 and the second guide portion 125 is deformed from an arcuate shape 21a to a substantially flat, shape 21c. The polishing tape 21 at the contact portion contacting the wafer 10 has an intermediate shape 21b between the arcuate shape 21a and the substantially flat shape 21c as shown in FIG. 20B.

Figure 21:
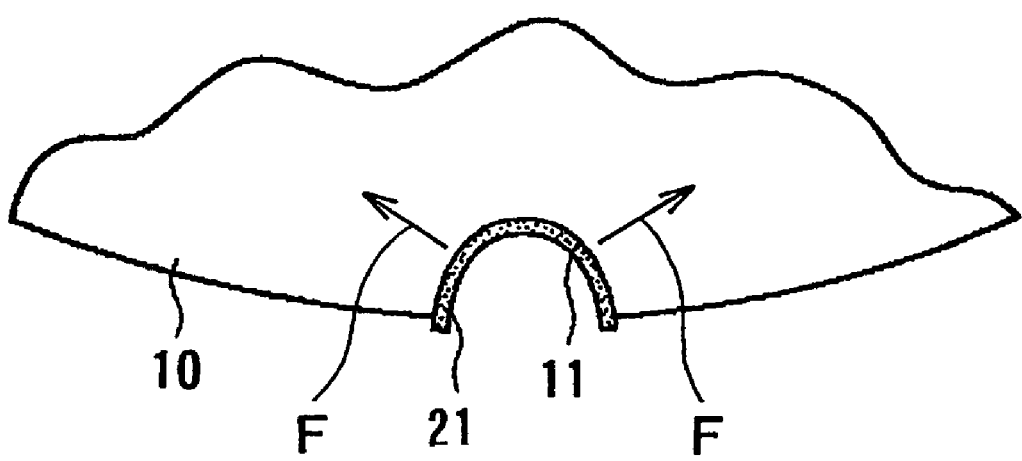
FIG. 21 is a plan view showing a contact state between a notch portion of a wafer and a polishing tape when the polishing mechanism of FIG. 19 is used.

As shown in FIG. 21, forces F to widen the polishing tape 21 from the arcuate shape 21a to the substantially flat shape 21c are applied to the intermediate shape 21b. Accordingly, when the polishing tape 21 is pressed against the notch portion 11 of the semiconductor wafer 10, end portions of the polishing tape 21 in the width direction reliably accord with the notch portion 11. Therefore, even if the shape of the notch portion 11 in the wafer 10 has a variation, the polishing tape 21 can reliably accord with the shape of the notch portion 11.

In the example shown in FIG. 19, the first guide portion 24 may be exchanged with the second guide portion 125. Specifically, a substantially flat guide surface having a curvature of zero in a cross-section perpendicular to the feed direction of the polishing tape 21 may be formed in the first guide portion, and a guide surface having a curvature of not zero in the cross-section perpendicular to the feed direction of the polishing tape 21 may be formed in the second guide portion. These configurations also achieve the similar effects to the above example.

Figure 22:
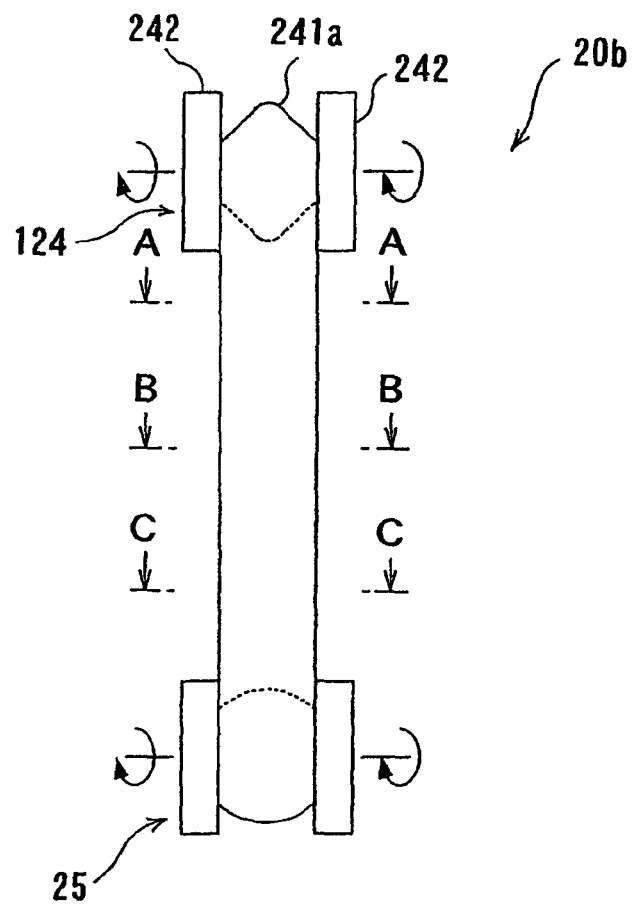
FIG. 22 is a front view showing a second variation of the polishing mechanism of FIG. 3.

FIG. 22 is a front view showing a second variation 20b of the polishing mechanism 20. The polishing mechanism 20b employs a first guide portion 124 having a guide surface 241a, which has a large curvature at a central portion in a cross-section perpendicular to a feed direction of the polishing tape 21, instead of the first guide portion 24 shown in FIG. 3. Other elements are the same as the polishing mechanism 20 shown in FIG. 3.

As shown in FIG. 22, the guide surface 241a of the first guide portion 124 has an arcuate shape with a large curvature at the central portion in the cross-section perpendicular to the feed direction of the polishing tape 21, and linear shapes extending from both sides of the arcuate shape to flanges 242. In this example, the guide surface of the second guide portion 25 also has a curvature of not zero in the cross-section perpendicular to the feed direction of the polishing tape 21. The curvature at the central portion of the guide surface 241a in the first guide portion 124 is larger than the curvature of the guide surface in the second guide portion 25.

Figure 23A:
FIG. 23A is a cross-sectional view taken along line A-A of FIG. 22.
Figure 23B:
FIG. 23B is a cross-sectional view taken along line B-B of FIG. 22.
Figure 23C:
FIG. 23C is a cross-sectional view taken along line C-C of FIG. 22.

With such an arrangement, the polishing tape 21 is brought into contact with the curved guide surface 241a of the first guide portion 124 while a certain tension is applied to the polishing tape 21. Accordingly, the polishing tape 21 is curved near the first guide portion 124 into an arcuate shape having a large curvature along the guide surface 241a of the first guide portion 124 as shown in FIG. 23A. Further, the polishing tape 21 is brought into contact with the guide surface of the second guide portion 25 while a certain tension is applied to the polishing tape 21. Accordingly, the polishing tape 21 is curved near the second guide portion 25 into an arcuate shape having a small curvature along the guide surface of the second guide portion 25 as shown in FIG. 23C.

Thus, the polishing tape 21 between the first guide portion 124 and the second guide portion 25 is deformed from an arcuate shape 21d having a large curvature to an arcuate shape 21f having a small curvature. The polishing tape 21 at the contact portion contacting the wafer 10 has an intermediate shape 21e between the arcuate shape 21d and the arcuate shape 21f as shown in FIG. 23B.

Forces to widen the polishing tape 21 from the arcuate shape 21d to the arcuate shape 21f are applied to the intermediate shape 21e. Accordingly, when the polishing tape 21 is pressed against the notch portion 11 of the semiconductor wafer 10, end portions of the polishing tape 21 in the width direction reliably accord with the notch portion 11. Therefore, even if the shape of the notch portion 11 in the wafer 10 has a variation, the polishing tape 21 can reliably accord with the shape of the notch portion 11.

As described above, this variation 20b can achieve the similar effects to the aforementioned first variation 20a. In this example, curvatures of the guide surfaces of the first guide portion and the second guide portion are adjusted to adjust a curvature of the polishing tape at the contact portion to a desired value. Thus, the polishing tape 21 can reliably accord with the shape of the notch portion 11. In the example shown in FIG. 22, the first guide portion 124 may be exchanged with the second guide portion 25.

FIG. 24 is a side cross-sectional view showing a third variation 20c of the polishing mechanism 20. As shown in FIG. 24, the polishing mechanism 20c has a third guide portion 224 and a fourth guide portion 225 in addition to the first guide portion 24 and the second guide portion 25 shown in FIG. 3. The third guide portion 224 is disposed upstream of the first guide portion 24 and has a guide surface for guiding the polishing tape 21 from the supply reel 22 to supply the polishing tape 21 directly to the first guide portion 24. Further, the fourth guide portion 225 is disposed downstream of the second guide portion 25 and has a guide surface for guiding the polishing tape 21 supplied directly from the second guide portion 25 to supply the polishing tape 21 to the take-up reel 23.

When the polishing tape 21 is fed only with the first guide portion 24 and the second guide portion 25 as shown in FIG. 3, the polishing tape 21 may slide from a central portion of the guide surface to a portion near either flange according to progress of the polishing process because the guide surfaces of the first guide portion 24 and the second guide portion 25 are curved.

The third guide portion 224 and the fourth guide portion 225 shown in FIG. 24 serve to prevent the polishing tape 21 from sliding on the guide surfaces of the first guide portion 24 and the second guide portion 25. The guide surfaces of the third guide portion 224 and the fourth guide portion 225 are substantially flat in a cross-section perpendicular to a feed direction of the polishing tape 21. As shown in FIG. 24, when the polishing tape 21 is not brought into contact with the wafer 10, a direction in which the polishing tape 21 is supplied from the guide surface of the third guide portion 224 to the guide surface of the first guide portion 24 is substantially the same as a direction in which the polishing tape 21 is supplied from the guide surface of the first guide portion 24 to the guide surface of the second guide portion 25. Similarly, when the polishing tape 21 is not brought into contact with the wafer 10, a direction in which the polishing tape 21 is supplied from the guide surface of the first guide portion 24 to the guide surface of the second guide portion 25 is substantially the same as a direction in which the polishing tape 21 is supplied from the guide surface of the second guide portion 25 to the guide surface of the fourth guide portion 225. When the third guide portion 224 and the fourth guide portion 225 are thus arranged, the polishing tape 21 is prevented from sliding on the guide surfaces of the first guide portion 24 and the second guide portion 25.

Figure 25:
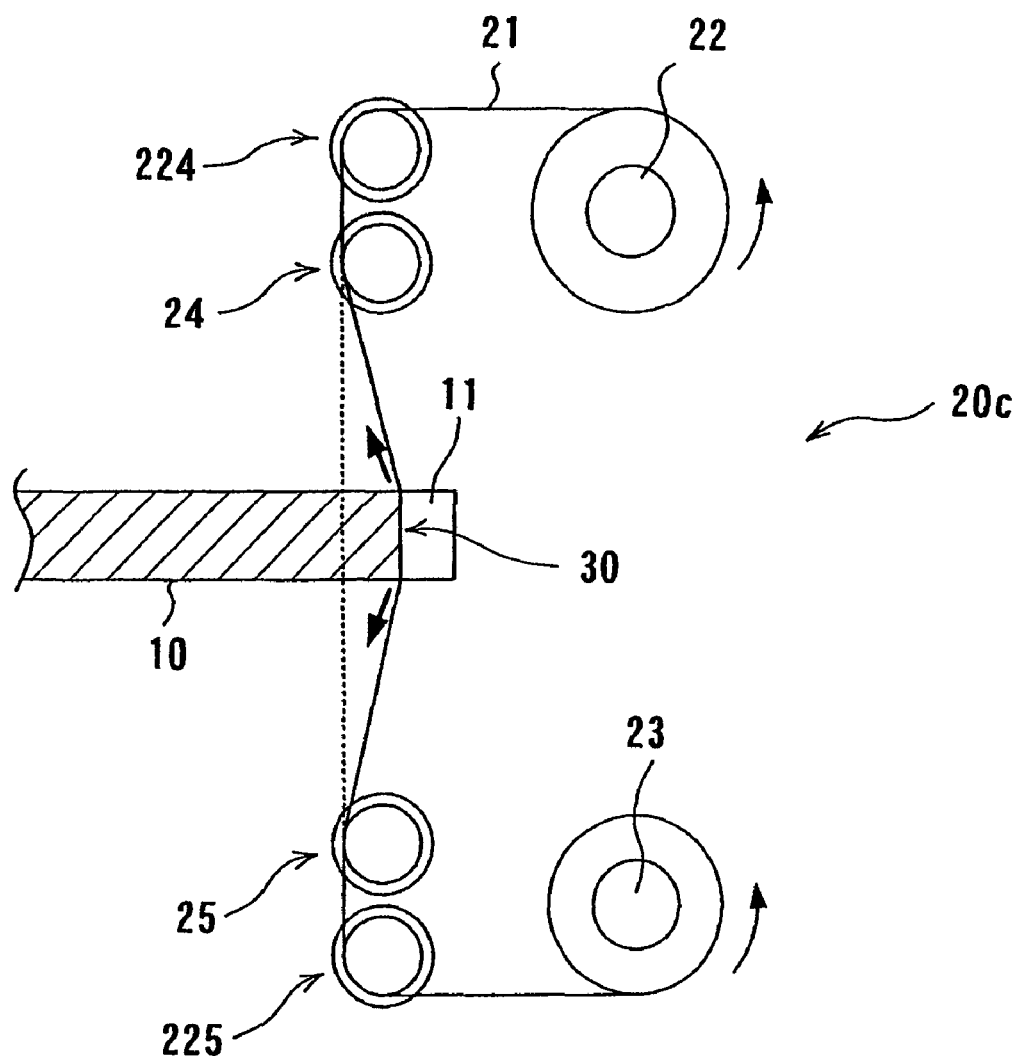
FIG. 25 is a side cross-sectional view showing a state in which the polishing mechanism of FIG. 24 is operated.

When the wafer 10 is separated from the polishing mechanism 20c as shown in FIG. 24, the first guide portion 24 and the second guide portion 25 are brought into slight contact with the polishing tape 21 at tips of the guide surfaces thereof. When the wafer 10 is pressed against the polishing tape 21 (or the polishing tape 21 is pressed against the wafer 10) as shown in FIG. 25, the polishing tape 21 is curved in the width direction by the guide surfaces of the first guide portion 24 and the second guide portion 25. The polishing tape 21 is supported upstream of the first guide portion 24 by the substantially flat guide surface of the third guide portion 224 and supported downstream of the second guide portion 25 by the substantially flat guide surface of the fourth guide portion 225. Accordingly, the polishing tape 21 is prevented from sliding on the guide surfaces of the first guide portion 24 and the second guide portion 25.

In this polishing mechanism 20c, the guide surfaces of the first guide portion 24 and the second guide portion 25 may have the same curvature or may have different curvatures to cope with a variation of the notch shape.

The present invention is not limited to the aforementioned embodiments. For example, a portion to be polished is not limited to a notch portion or a bevel portion of a semiconductor wafer and may be any portion that can be polished by contact with a polishing tape. Further, a direction in which the polishing tape is moved in sliding contact when the notch portion of the semiconductor wafer is polished is not limited to a direction perpendicular to a surface of the wafer and may be inclined with respect to the direction perpendicular to the surface of the wafer.

Although certain preferred embodiments of the present invention have been shown and described in detail, it should be understood that various changes and modifications may be made therein without departing from the scope of the appended claims.

INDUSTRIAL APPLICABILITY

The present invention is suitable for use in a polishing apparatus to polish a substrate such as a semiconductor wafer by a polishing tape.

The invention claimed is:
1. A polishing apparatus comprising:
a polishing tape;
a supply reel for supplying said polishing tape to a contact portion at which said polishing tape is brought into contact with a notch portion formed at a peripheral portion of a substrate;
a take-up reel for winding up said polishing tape from the contact portion;
a first guide portion having a guide surface for guiding said polishing tape from said supply reel to supply said polishing tape directly to the contact portion;
a second guide portion having a guide surface for guiding said polishing tape supplied directly from the contact portion to supply said polishing tape to said take-up reel; and
a drive mechanism configured to move said polishing tape and the substrate relative to each other to polish the notch portion of the substrate, wherein at least one of said guide surface of said first guide portion and said guide surface of said second guide portion has a curved surface which is curved along a width direction of to deform part of the polishing tape in conformity and corresponds to a shape of the notch portion of the substrate, and wherein said first guide portion is disposed at a position above a front face of the substrate and said second guide portion is disposed at a position below a rear face of the substrate such that said polishing tape extends between said first guide portion and said second guide portion in a direction perpendicular to a surface of the substrate and at a tension so as to apply a predetermined pressing force to the notch portion of the substrate at the contact portion wherein the deformed part of the polishing tape contacts and polishes the notch portion.

2. The polishing apparatus as recited in claim 1, wherein said guide surface of said first guide portion and said guide surface of said second guide portion have different curvatures in a cross-section perpendicular to a feeding direction of said polishing tape.

3. The polishing apparatus as recited in claim 1, wherein one of said guide surface of said first guide portion and said guide surface of said second guide portion has said curved surface, and wherein the other of said guide surface of said first guide portion and said guide surface of said second guide portion is substantially flat along the width direction of said polishing tape.

4. The polishing apparatus as recited in claim 1, further comprising at least one of a third guide portion having a guide surface, which is substantially flat along the width direction of said polishing tape, for guiding said polishing tape from said supply reel to supply said polishing tape directly to said first guide portion; and a fourth guide portion having a guide surface, which is substantially flat along the width direction of said polishing tape, for guiding said polishing tape supplied directly from said second guide portion to supply said polishing tape to said take-up reel.

5. A polishing apparatus comprising:
a polishing tape;
a supply reel for supplying said polishing tape to a contact portion at which said polishing tape is brought into contact with a bevel portion of a substrate;
a take-up reel for winding up said polishing tape from the contact portion;
a first guide portion having a guide surface for guiding said polishing tape from said supply reel to supply said polishing tape directly to the contact portion;
a second guide portion having a guide surface for guiding said polishing tape supplied directly from the contact portion to supply said polishing tape to said take-up reel; and
a drive mechanism configured to move said polishing tape and the substrate relative to each other to polish the bevel portion of the substrate,
wherein said first guide portion includes:
a guide member which is to be brought into contact with said polishing tape, said guide member having said guide surface of said first guide portion and having a trapezoidal cross-section which corresponds to a shape of the bevel portion of the substrate; and
a pressing member disposed along said guide surface of said first guide portion for pressing said polishing tape against said guide surface of said first guide portion, said pressing member including a pair of rollers disposed along surfaces of said guide member.

6. The polishing apparatus as recited in claim 5, further comprising at least one polishing head for pressing said polishing tape against the bevel portion of the substrate.

7. The polishing apparatus as recited in claim 6, wherein said polishing head comprises an elastic member for pressing said polishing tape against the bevel portion of the substrate.

8. The polishing apparatus as recited in claim 6, further comprising a plurality of polishing heads for pressing said polishing tape against the bevel portion of the substrate at contact angles independently set.

9. The polishing apparatus as recited in claim 8, wherein each of said plurality of polishing heads has an elastic member for pressing said polishing tape against the bevel portion of the substrate, and wherein said elastic members of said plurality of polishing heads have different elasticity.

10. A polishing method comprising:
supplying a polishing tape to a guide surface of a first guide portion disposed at a position above a front surface of a substrate;
supplying said polishing tape from said guide surface of said first guide portion directly to a contact portion at which said polishing tape is brought into contact with a notch portion formed at a peripheral portion of the substrate;
supplying said polishing tape from the contact portion directly to a guide surface of a second guide portion disposed at a position below a rear surface of the substrate;
deforming a portion of said polishing tape so as to correspond to a shape of the notch portion of the substrate by at least one of said guide surface of said first guide portion and said guide surface of said second guide portion, said at least one of said guide surface of said first guide portion and said guide surface of said second guide portion having a curved surface that is curved along a width direction of said polishing tape and corresponds to a shape of the notch portion of the substrate; and
moving the substrate and said deformed portion of the polishing tape relative to each other to polish the notch portion of the substrate while applying a tension to said polishing tape so as to press said deformed portion of the polishing tape against the notch portion of the substrate.

11. The polishing method as recited in claim 10, wherein said guide surface of said first guide portion and said guide surface of said second guide portion have different curvatures in a cross-section perpendicular to a feeding direction of said polishing tape.

12. The polishing method as recited in claim 10, wherein one of said guide surface of said first guide portion and said guide surface of said second guide portion has said curved surface, and wherein the other of said guide surface of said first guide portion and said guide surface of said second guide portion is substantially flat along the width direction of said polishing tape.

13. The polishing method as recited in claim 10, wherein said polishing tape extends between said first guide portion and said second guide portion in a direction perpendicular to a surface of the substrate.

* * * * *

UNITED STATES PATENT AND TRADEMARK OFFICE
CERTIFICATE OF CORRECTION

| | | |
|---|---|---|
| PATENT NO. | : 7,744,445 B2 | Page 1 of 1 |
| APPLICATION NO. | : 11/665001 | |
| DATED | : June 29, 2010 | |
| INVENTOR(S) | : Takeo Kubota et al. | |

It is certified that error appears in the above-identified patent and that said Letters Patent is hereby corrected as shown below:

In column 13, line 4, please change "width direction of" to --width direction of said polishing tape--.

In column 13, line 5, please change "conformity and corresponds to" to --conformity to--.

Signed and Sealed this
Thirteenth Day of November, 2012

David J. Kappos
*Director of the United States Patent and Trademark Office*